(12) United States Patent
Farooq et al.

(10) Patent No.: US 7,245,022 B2
(45) Date of Patent: Jul. 17, 2007

(54) SEMICONDUCTOR MODULE WITH IMPROVED INTERPOSER STRUCTURE AND METHOD FOR FORMING THE SAME

(75) Inventors: Mukta G. Farooq, Hopewell Junction, NY (US); John U. Knickerbocker, Wappingers Falls, NY (US); Frank L. Pompeo, Redding, CT (US); Subhash L. Shinde, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 10/721,984

(22) Filed: Nov. 25, 2003

(65) Prior Publication Data

US 2005/0110160 A1    May 26, 2005

(51) Int. Cl.
 *H01L 23/48* (2006.01)
(52) U.S. Cl. .............. 257/778; 257/E23.067; 257/E23.101; 257/E23.294; 257/E21.503; 257/712; 257/713; 257/717; 257/774; 257/773; 257/668; 257/704; 257/710; 257/675; 257/734; 257/737; 257/738; 257/780; 324/754; 324/758; 174/255; 174/256; 174/260; 361/748; 361/760; 439/65; 439/66; 439/91
(58) Field of Classification Search ........ 257/E23.067, 257/E23.101, E23.194, E21.503, 712, 713, 257/717, 720, 675, 704, 710, 773, 774, 668, 257/778, 734, 737, 738, 780; 324/754, 758; 174/255, 256
See application file for complete search history.

(56) References Cited

U.S. PATENT DOCUMENTS

| | | | |
|---|---|---|---|
| 5,569,963 A | 10/1996 | Rostoker et al. | |
| 5,703,753 A | 12/1997 | Mok | |
| 5,729,433 A | 3/1998 | Mok | |
| 5,734,201 A | 3/1998 | Djennas et al. | |
| 5,770,891 A | 6/1998 | Frankeny et al. | |
| 5,821,624 A | 10/1998 | Pasch | |
| 5,842,273 A | 12/1998 | Schar | |
| 6,124,546 A | 9/2000 | Hayward et al. | |
| 6,133,744 A * | 10/2000 | Yojima et al. | ............... 324/754 |
| 6,224,396 B1 | 5/2001 | Chan et al. | |
| 6,252,301 B1 | 6/2001 | Gilleo et al. | |
| 6,264,476 B1 * | 7/2001 | Li et al. | ........................ 439/66 |
| 6,286,208 B1 * | 9/2001 | Shih et al. | ..................... 29/879 |
| 6,294,407 B1 * | 9/2001 | Jacobs | ........................ 438/118 |
| 6,365,978 B1 * | 4/2002 | Ibnabdeljalil et al. | ....... 257/786 |
| 6,386,890 B1 | 5/2002 | Bhatt et al. | |
| 6,399,892 B1 * | 6/2002 | Milkovich et al. | .......... 174/258 |
| 6,434,017 B1 | 8/2002 | Iwabuchi | |
| 6,459,039 B1 * | 10/2002 | Bezama et al. | ............. 174/359 |
| 6,486,415 B2 | 11/2002 | Jimarez et al. | |
| 6,516,513 B2 * | 2/2003 | Milkovich et al. | ............ 29/830 |
| 6,524,115 B1 | 2/2003 | Gates et al. | |

(Continued)

*Primary Examiner*—Alexander Oscar Williams
(74) *Attorney, Agent, or Firm*—Ronald A. Kaschak; Hoffman, Warnick & D'Alessandro

(57) ABSTRACT

Under the present invention, a semiconductor chip is electrically connected to a substrate (e.g., organic, ceramic, etc.) by an interposer structure. The interposer structure comprises an elastomeric, compliant material that includes metallurgic through connections having a predetermined shape. In a typical embodiment, the metallurgical through connections electrically connect an under bump metallization of the semiconductor chip to a top surface metallization of the substrate. By utilizing the interposer structure in accordance with the present invention, the problems associated with previous semiconductor module designs are alleviated.

20 Claims, 5 Drawing Sheets

U.S. PATENT DOCUMENTS

| | | | |
|---|---|---|---|
| 6,541,867 B1* | 4/2003 | Fjelstad | 257/773 |
| 6,545,226 B2* | 4/2003 | Brodsky et al. | 174/260 |
| 6,573,609 B2 | 6/2003 | Fjelstad et al. | |
| 6,756,797 B2* | 6/2004 | Brandorff et al. | 324/754 |
| 6,774,315 B1* | 8/2004 | Pierson et al. | 174/261 |
| 6,830,177 B2* | 12/2004 | Pai | 228/180.21 |
| 6,836,011 B2* | 12/2004 | Azuma | 257/700 |
| 6,870,272 B2* | 3/2005 | Kovac et al. | 257/778 |
| 6,875,921 B1* | 4/2005 | Conn | 174/534 |
| 6,974,915 B2* | 12/2005 | Brodsky et al. | 174/260 |
| 6,978,542 B2* | 12/2005 | Alcoe | 29/879 |
| 6,981,880 B1* | 1/2006 | Brodsky et al. | 439/66 |
| 7,042,077 B2* | 5/2006 | Walk et al. | 257/686 |
| 7,083,436 B2* | 8/2006 | Brodsky | 439/91 |
| 2001/0044197 A1 | 11/2001 | Heinen et al. | |
| 2002/0000650 A1 | 1/2002 | Smith et al. | |
| 2002/0030261 A1* | 3/2002 | Rolda et al. | 257/685 |
| 2002/0088116 A1* | 7/2002 | Milkovich et al. | 29/846 |
| 2002/0109514 A1 | 8/2002 | Brandorff et al. | |
| 2002/0127893 A1 | 9/2002 | Brodsky | |
| 2002/0130677 A1 | 9/2002 | Hembree et al. | |
| 2002/0182900 A1 | 12/2002 | Brodsky et al. | |
| 2003/0027373 A1 | 2/2003 | DiStefano et al. | |
| 2003/0038378 A1* | 2/2003 | Jacobs | 257/783 |
| 2003/0049952 A1* | 3/2003 | Pai | 439/68 |
| 2003/0094666 A1 | 5/2003 | Clayton et al. | |
| 2003/0103338 A1* | 6/2003 | Vandentop et al. | 361/767 |
| 2003/0209813 A1* | 11/2003 | Azuma | 257/797 |
| 2004/0018753 A1* | 1/2004 | Kung et al. | 439/66 |
| 2004/0029411 A1* | 2/2004 | Rathburn | 439/66 |
| 2004/0135594 A1* | 7/2004 | Beaman et al. | 324/765 |
| 2004/0203268 A1* | 10/2004 | Nishizawa | 439/91 |
| 2005/0208785 A1* | 9/2005 | Kuczynski et al. | 439/66 |

* cited by examiner

SEMICONDUCTOR MODULE WITH IMPROVED INTERPOSER STRUCTURE AND METHOD FOR FORMING THE SAME

BACKGROUND OF THE INVENTION

1. Field of the Invention

The present invention generally relates to a semiconductor module and method for forming the same. Specifically, the present invention provides a semiconductor module having an interposer structure with metallurgical through connections for electrically connecting a semiconductor chip to a substrate.

2. Related Art

In the production of semiconductor modules, a semiconductor chip is often connected to a carrier such as a substrate. Typically, the connection is made using controlled collapse chip connection (C4) technology whereby solder bumps are used to join the two components together. Unfortunately, several problems emerge with the existing technology. First, the semiconductor chip usually has a different coefficient of thermal expansion (CTE) than the substrate. Given the close physical proximity of the semiconductor chip to the substrate, the solder bumps often deteriorate as the module heats up and cools off. This is especially the case with larger die sizes.

In addition, ceramic substrates (if used) are generally non-planar, which can become a gating factor as the substrate X-Y dimensions increase. With shrinking pitch, there is a need to shrink C4 bump dimensions to avoid nearest neighbor shorting. However, a small C4 bump height results in a larger percentage of variation across the grid of bumps. Further, when the interconnections at the chip to substrate level migrate to a lead-free system, there will be no solder temperature hierarchy between first and second level interconnections, thus, creating an increased strain on the C4 structure due to higher temperatures of subsequent assembly operations. Still yet, current methods of depositing and joining C4 interconnections are expensive and involve the use of specific under bump metallization (UBM), which might have to be customized. Also, the UBM may need additional layers such as diffusion barriers and chip encapsulants so that it may endure a melting or partially melting C4 structure that reacts with the UBM during subsequent assembly operations.

In view of the foregoing, there exists a need for an improved semiconductor module and method for forming the same. Specifically, a need exists for a semiconductor chip to be electrically connected to a substrate or the like so that the above concerns are alleviated.

SUMMARY OF THE INVENTION

In general, the present invention provides a semiconductor module and method for forming the same. Specifically, under the present invention, a semiconductor chip is electrically connected to a substrate (e.g., organic, ceramic, etc.) by an interposer structure. The interposer structure comprises an elastomeric, compliant material that includes metallurgical through connections having a predetermined shape. In a typical embodiment, the metallurgical through connections electrically connect an under bump metallization of the semiconductor chip to a top surface metallization of the substrate. By utilizing the interposer structure in accordance with the present invention, the problems associated with previous semiconductor module designs are alleviated.

A first aspect of the present invention provides a semiconductor module, comprising a semiconductor chip; a substrate; and an interposer structure electrically connecting the semiconductor chip to the substrate, wherein the interposer structure includes metallurgical through connections having a predetermined shape.

A second aspect of the present invention provides a semiconductor module, comprising a semiconductor chip having an under bump metallization; a substrate having a top surface metallization; and an interposer structure electrically connecting the under bump metallization to the top surface metallization, wherein the interposer structure comprises an elastomeric, compliant material that includes metallurgical through connections having a predetermined shape.

A third aspect of the present invention provides a method for forming a semiconductor module, comprising: embedding metallurgical through connections within an elastomeric, compliant material to form an interposer structure; and positioning the interposer structure between a semiconductor chip and a substrate to electrically connect the semiconductor chip to the substrate.

Therefore, the present invention provides a semiconductor module and method for forming the same.

BRIEF DESCRIPTION OF THE DRAWINGS

These and other features of this invention will be more readily understood from the following detailed description of the various aspects of the invention taken in conjunction with the accompanying drawings in which.

Figure 1:
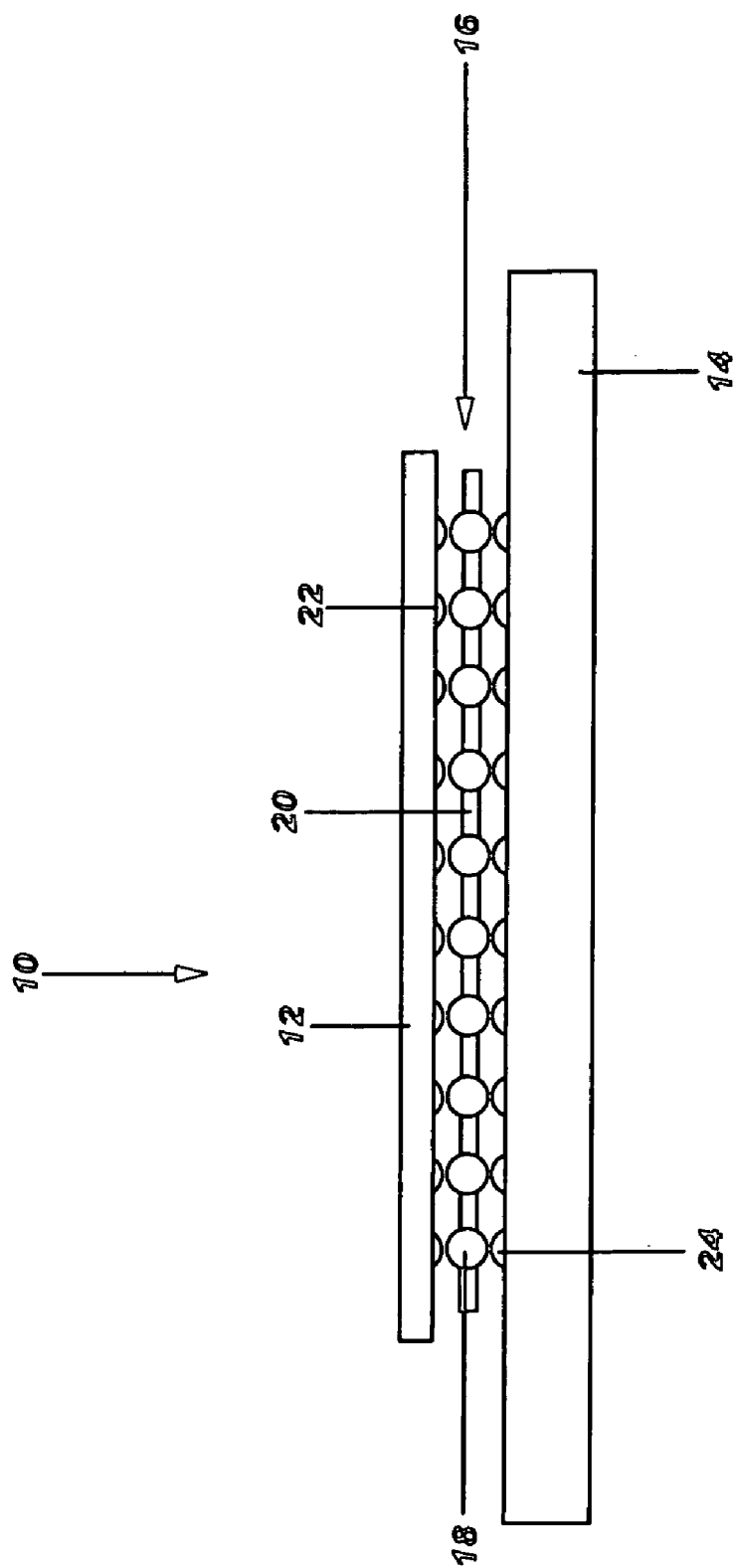
FIG. 1 depicts a semiconductor module having an interposer structure, according to the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a semiconductor module and method for forming the same. Specifically, under the present invention, a semiconductor chip is electrically connected to a substrate (e.g., organic, ceramic, etc.) by an interposer structure. The interposer structure comprises an elastomeric, compliant material that includes metallurgical through connections having a predetermined shape. In a typical embodiment, the metallurgical through connections electrically connect an under bump metallization of the semiconductor chip to a top surface metallization of the substrate. By utilizing the interposer structure in accordance with the present invention, the problems associated with previous semiconductor module designs are alleviated.

Referring now to FIG. 1, an illustrative semiconductor module 10 formed in accordance with the present invention is shown. As depicted, semiconductor module 10 includes semiconductor chip 12 and carrier/substrate 14 with interposer structure 16 positioned therebetween. It should be appreciated in advance that semiconductor module 10 could be a single chip module or a multi-chip module. In the case of a multi-chip module, interposer structure 16 could be positioned between each semiconductor chip and substrate 14. Moreover, it should be understood that substrate 14 could be any type of substrate now known or later developed. For example, substrate 14 could be ceramic or organic. In any event, interposer structure 16 is positioned between semiconductor chip 12 and substrate 14 under the present invention to preserve the interface therebetween. As indicated above, differences in the CTE between semiconductor chip 12 (e.g., 3 ppm/° C., CTE) and substrate 14 (15–18 ppm/° C., CTE for an organic substrate) cause various issues as semiconductor module 10 is subjected to temperature change. Positioning interposer structure 16 between semiconductor chip 12 and substrate 14 increases the distance between the two components and alleviates the problems associated with the difference in CTEs.

In any event, interpose structure 16 generally comprises a elastomeric, compliant material 20 having metallurgical through connections 18 "embedded" or "positioned" therein. Metallurgical through connections 18 electrically connect under bump metallization (UBM) or bottom layer metallurgy (BLM) 22 of semiconductor chip 12 to top surface metallurgy (TSM) 24 of substrate 14. In a typical embodiment, interposer structure 16 can comprise an anisotropic conductive film, such as CUPIL-T, which is commercially available from Nitto Denko, Inc. of Osaka, Japan. Moreover, metallurgical through connections 18 can be formed to have a predetermined shape depending on the load applied to semiconductor module 10 to best optimize the contact. For example, metallurgical through connections 18 could be spherical, ellipsoid, s-shaped, c-shaped, or elongate (i.e., column-like), various factors can be considered when determining the shape of metallurgical through connections 18. Such factors include, among other things: (1) camber (i.e., non-flatness of substrate 14 and semiconductor chip 12) in that more camber might mean taller through connections with an overall greater degree of compressibility; (2) distortion (i.e., positional accuracy of the I/O pads on substrate 14) in that the worse the distortion, the bigger the contact area on metallurgical through connections 18 that would have to be provided so that some degree of contact is always present between metallurgical through connections 18 and the I/O pads; and (3) process considerations such as how the through connections are made. In addition, metallurgical through connections 18 could be formed from one or more materials. To this extent, metallurgical through connections 18 could have a core formed from Copper, Copper-Beryllium, or the like that is coated with gold. Still yet, UBM 22 and/or TSM 24 could be gold, solder or the like.

To provide a more stable structure, interposer structure 16 could be rigidly attached (e.g., hard soldered) to either UBM 22 or TSM 24, or both. For example, if semiconductor module 10 is placed under a Land Grid Array (LGA) load, metallurgical through connections 18 could be hard soldered to TSM 24, while the contact between metallurgical through connections 18 and UBM 22 is maintained solely by the LGA load. This would enable free expansion of the semiconductor chip side of interposer structure 16 under the influence of temperature. Since interposer structure 16 would not cause any strains due to TCE mismatch, the reliability of semiconductor module 10 would increase considerably. Further, this method would allow for self-aligned solder joining of metallurgical through connections 18 to the I/O pads on substrate 14, thus eliminating the concern of inadequate surface contact area when the I/O pad distortion is on the high end of the specification.

Figure 2:
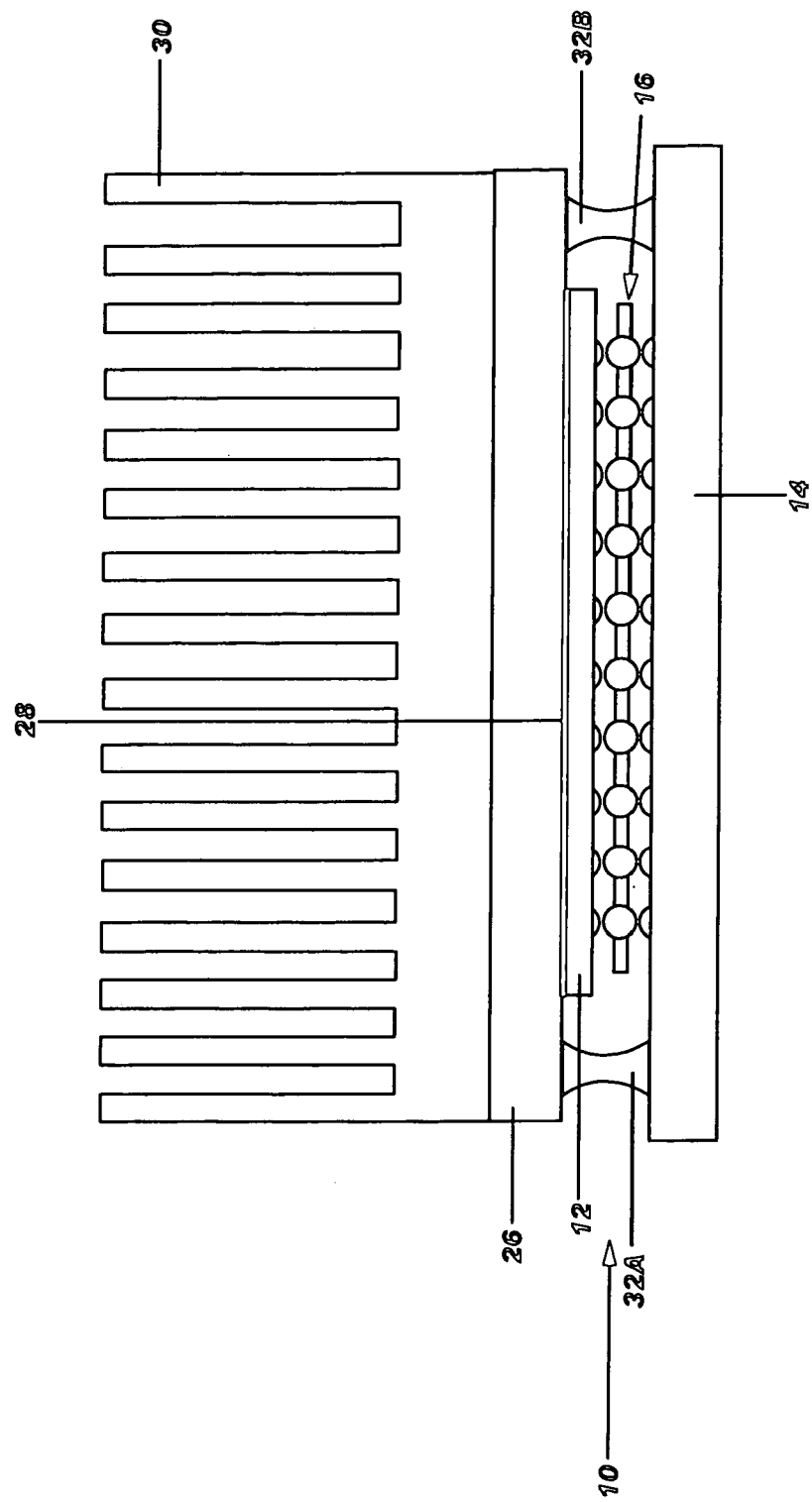
FIG. 2 depicts the semiconductor module of FIG. 1 further including a heat spreader and a heat sink.

Referring now to FIG. 2, semiconductor module 10 of FIG. 1 further including a heat spreader 26 and heat sink 30 is shown. As depicted, heat spreader 26 is attached to semiconductor chip 12 using thermally conductive adhesive 28. To prevent the increased weight cause by heat spreader 26 and heat sink 30 from damaging semiconductor chip 12, substrate 14 and/or interposer structure 16, support posts 32A–B can be provided adjacent to interposer structure 16. Specifically, support posts 32A–B extend from substrate 14 to heat spreader 26, and support heat spreader 26 over semiconductor chip 12. It should be appreciated that the quantity of support posts 32A–B shown in FIG. 2 is intended to be illustrative only, and should not be limiting.

Regardless, to further seal interposer member 16 between semiconductor chip 12 and substrate 14, underfill could be provided. Specifically, referring to FIG. 3, semiconductor module 10 of FIG. 2 is shown as further including underfill 34. Under the present invention, underfill 34 can be provided throughout the interconnection, or at predetermined locations. Further, underfill 34 can be a heat-curable material, selected from a broad range of chemical compositions including both rigid and flexibilized thermosetting epoxies, thermoplastics, urethanes, polysulfones, polyimides, polyetheramides/imides, and hybrids of same. Alternatively, underfill 34 can be a more compliant, thermoplastic material such as a silicone based product.

In any event, when underfill 34 is used, metallurgical through connections 18 could be rigidly attached to both UBM 22 and TSM 24 to provide a desired level of thermomechanical fatigue. To this extent, underfill 34 may be applied between interposer structure 16 and semiconductor chip 12, between interposer structure 16 and substrate 14, or between semiconductor chip 12 and substrate 14 (including interposer structure 16). In a typical embodiment, it is desirable to rigidly affix interposer structure 16 to substrate 14 whenever metallurgical through connections 18 are soldered to the substrate 14. In this case, a typical, high-modulus of elasticity underfill is indicated, e.g, materials having modulus ranging from 1–10 Giga Pascals. Similarly, yet another embodiment uses underfill 34 between semiconductor chip 12 and interposer structure 16 if metallurgical through connections 18 are permanently attached to the semiconductor chip 12.

In yet another embodiment of the invention, a more compliant, flexible, underfill material (having elastic modulus in the tens or hundreds of Mega Pascals, for example) is provided between the semiconductor chip 12 and substrate, including metallurgical through connections 18. This feature would allow lateral displacement of the electrical contacts in response to thermally-induced stresses while preserving environmental protection of the IC devices(s) and joints.

Figure 3:
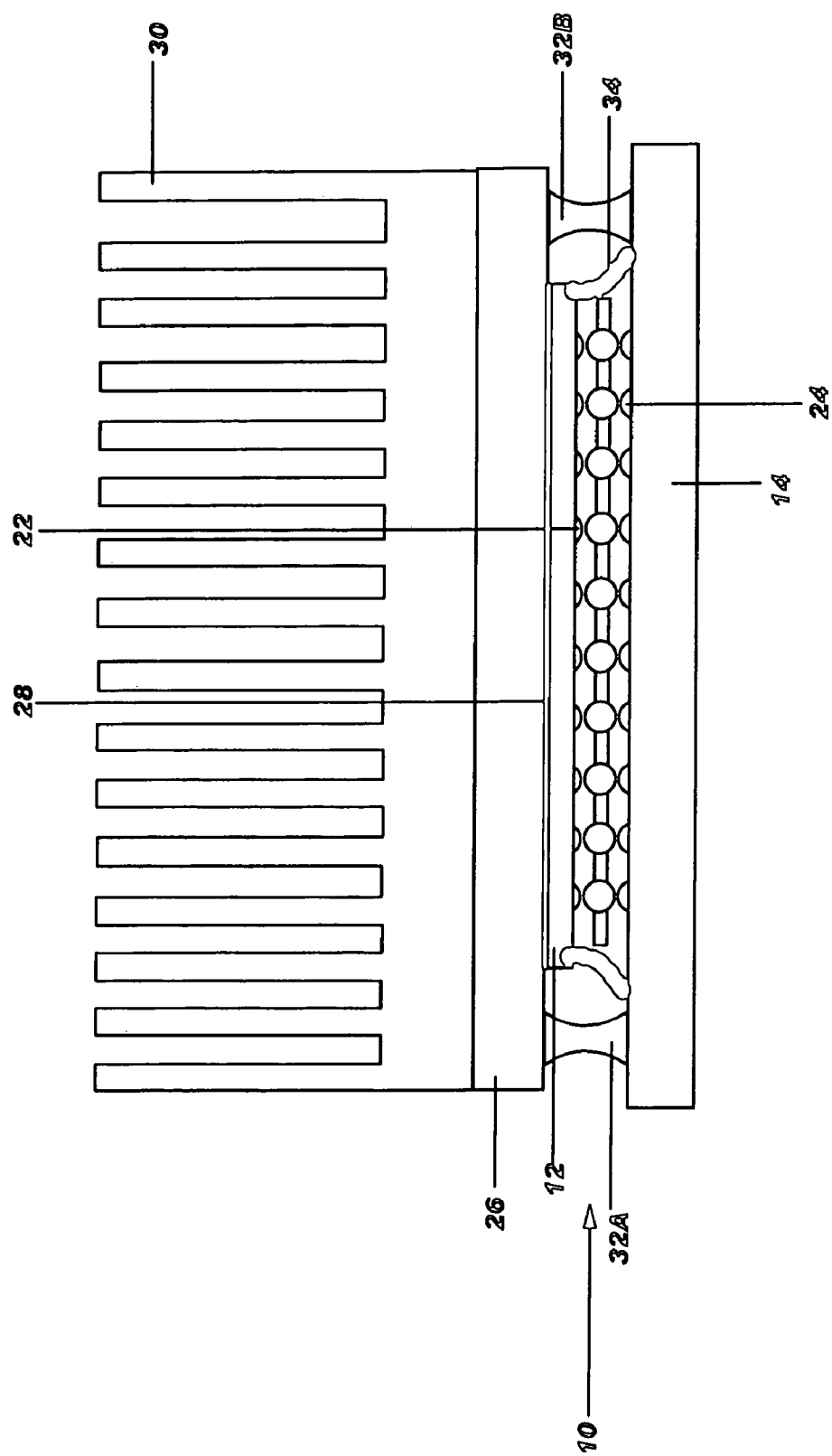
FIG. 3 depicts the semiconductor module of FIG. 2 further including underfill.
Figure 4:
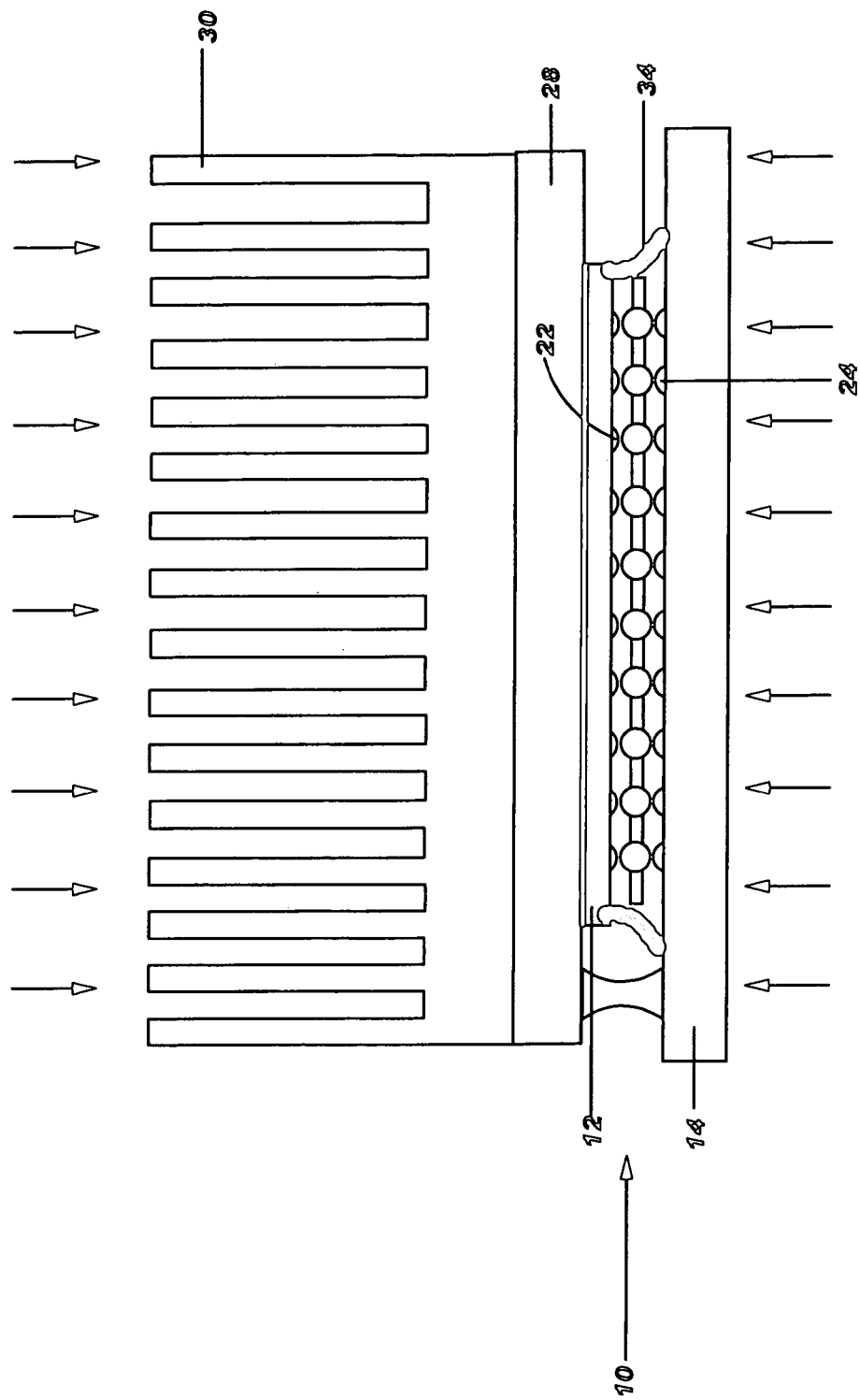
FIG. 4 depicts the semiconductor module of FIG. 3 under a Land Grid Array load.
Figure 5:
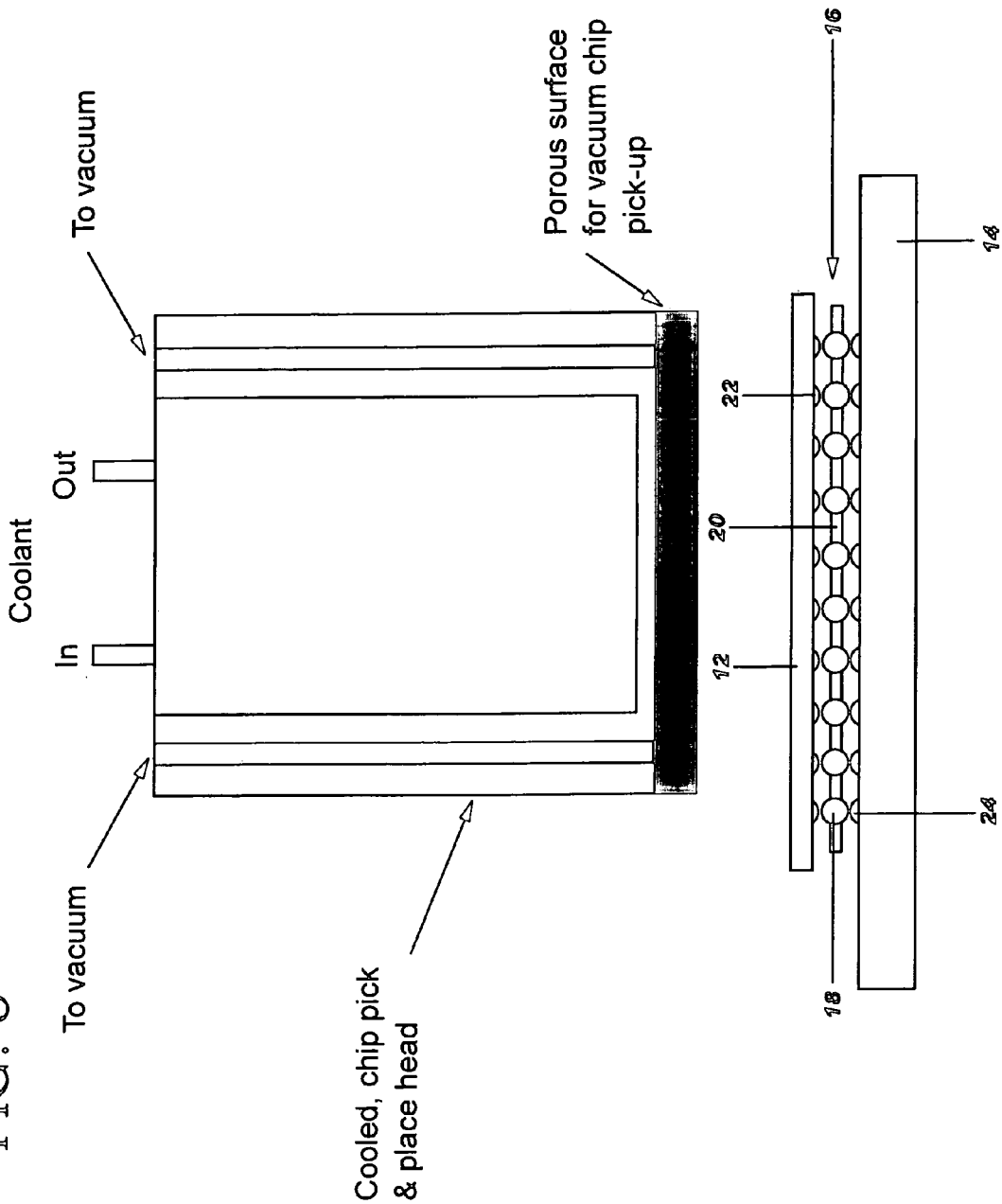
FIG. 5 depicts the semiconductor module of FIG. 1 in a TCA application.

Referring now to FIG. 4, semiconductor module 10 of FIG. 3 under an LGA load is shown. Under an LGA load, forces are exerted on semiconductor module 10 in the direction of the arrows shown. As indicated above in conjunction with FIG. 1, metallurgical through connections 18 could be rigidly attached to TSM 24 under such a load. Referring to FIG. 5, semiconductor module 10 under a Temporary Chip Attachment (TCA) application is depicted. Under a TCA application, a porous surface is provided for vacuum pickup and/or placement of semiconductor chip 10. Accordingly, as can be seen, interposer structure 16 can be used within semiconductor modules 10 in a variety of scenarios and applications. In addition, although not shown herein, interposer structure 16 could be used as a fan-out layer so that a very fine pitch in UBM 22 may be connected to a more coarse pitch in substrate 14.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims. For example, in another embodiment, interposer structure 16 could be integrated at the wafer level (e.g., 8 or 12 inch wafers) and electrically tested before chip singulation (e.g., dicing) is performed.

We claim:

1. A semiconductor module, comprising:
   a semiconductor chip;
   a substrate; and
   an interposer structure having a connection only to the semiconductor chip and to the substrate, wherein the interposer structure includes an elastomeric, compliant material having metallurgical through connections having a predetermined shape and a discrete metallurgical core, wherein the metallurgical through connections form the only connections to the semiconductor chip and to the substrate.

2. The semiconductor module of claim 1, wherein the elastomeric, compliant material has the metallurgical through connections being one of the group consisting of: embedded and positioned therein.

3. The semiconductor module of claim 1, wherein the predetermined shape is selected from the group consisting of spherical, elongate, c-shaped, s-shaped and ellipsoid.

4. The semiconductor module of claim 1, further comprising support posts positioned adjacent to and in non-contact with the interposer structure.

5. The semiconductor module of claim 4, wherein the support posts support a heat spreader over the semiconductor chip.

6. The semiconductor module of claim 1, further comprising underfill for sealing the interposer structure between the semiconductor chip and the substrate.

7. The semiconductor module of claim 1, wherein the metallurgical through connections of the interposer structure electrically connect an under bump metallization of the semiconductor chip to a top surface metallization of the substrate.

8. The semiconductor module of claim 7, wherein the metallurgical through connections are soldered to at least one of the under bump metallization or the top surface metallization.

9. The semiconductor module of claim 1, wherein the metallurgical through connections cores are coated with gold.

10. A semiconductor module, comprising:
    a semiconductor chip having an under bump metallization;
    a substrate having a top surface metallization; and
    an interposer structure only in contact with the under bump metallization and the top surface metallization, wherein the interposer structure comprises an elastomeric, compliant material that includes metallurgical through connections having a predetermined shape and a discrete metallurgical core, wherein the metallurgical through connections form the only connections to the under bump metallization and to the top surface metallization.

11. The semiconductor module of claim 10, wherein the predetermined shape is selected from the group consisting of spherical, elongate, c-shaped, s-shaped and ellipsoid.

12. The semiconductor module of claim 10, further comprises support posts positioned adjacent to and in non-contact with the interposer structure for supporting a heat spreader over the semiconductor chip.

13. The semiconductor module of claim 10, further comprising underfill for sealing the interposer structure between the semiconductor chip and the substrate.

14. The semiconductor module of claim 10, wherein the metallurgical through connections are soldered to at least one of the under bump metallization or the top surface metallization.

15. The semiconductor module of claim 10, wherein the metallurgical through connections cores are coated with gold.

16. A method for forming a semiconductor module, comprising:
    embedding metallurgical through connections having discrete metallurgical cores within an elastomeric, compliant material to form an interposer structure; and
    positioning the interposer structure between a semiconductor chip and a substrate to electrically connect and only contact the semiconductor chip to the substrate, wherein the metallurgical through connections form the only contact to the semiconductor chip and to the substrate.

17. The method of claim 16, wherein the metallurgical through connections electrically connect an under bump metallization of the semiconductor chip to a top surface metallization of the substrate.

18. The method of claim 17, further comprising soldering the interposer structure to at least one of the under bump metallization or the top surface metallization.

19. The method of claim 16, further comprising positioning support posts adjacent to and in non-contact with the interposer structure to support a heat spreader over the semiconductor chip.

20. The method of claim 16, further comprising sealing the interposer structure between the semiconductor chip and the substrate with underfill.

* * * * *